US006906781B2

(12) United States Patent
Berger

(10) Patent No.: US 6,906,781 B2
(45) Date of Patent: Jun. 14, 2005

(54) RETICLE STAGE BASED LINEAR DOSIMETER

(75) Inventor: Kurt W. Berger, Livermore, CA (US)

(73) Assignee: EUV LLC., Santa Clara, CA (US)

(*) Notice: Subject to any disclaimer, the term of this patent is extended or adjusted under 35 U.S.C. 154(b) by 260 days.

(21) Appl. No.: 10/264,062

(22) Filed: Oct. 2, 2002

(65) Prior Publication Data

US 2004/0067426 A1 Apr. 8, 2004

(51) Int. Cl.[7] ............................ G03B 27/42; G03B 27/54
(52) U.S. Cl. ................................... 355/53; 355/67
(58) Field of Search .................... 355/53, 67, 71; 356/399–401

(56) References Cited

U.S. PATENT DOCUMENTS

| 6,078,381 | A | * | 6/2000 | Suzuki | 355/53 |
|---|---|---|---|---|---|
| 6,188,150 | B1 | | 2/2001 | Spence | |
| 6,259,510 | B1 | * | 7/2001 | Suzuki | 355/53 |
| 6,353,271 | B1 | | 3/2002 | Williams | |
| 6,411,364 | B1 | * | 6/2002 | Suzuki | 355/53 |
| 2002/0001760 | A1 | * | 1/2002 | Gianoulakis et al. | 430/5 |

* cited by examiner

Primary Examiner—Rodney Fuller
(74) Attorney, Agent, or Firm—Fliesler Meyer LLP

(57) ABSTRACT

A detector to measure EUV intensity employs a linear array of photodiodes. The detector is particularly suited for photolithography systems that includes: (i) a ringfield camera; (ii) a source of radiation; (iii) a condenser for processing radiation from the source of radiation to produce a ringfield illumination field for illuminating a mask; (iv) a reticle that is positioned at the ringfield camera's object plane and from which a reticle image in the form of an intensity profile is reflected into the entrance pupil of the ringfield camera, wherein the reticle moves in a direction that is transverse to the length of the ringfield illumination field that illuminates the reticle; (v) detector for measuring the entire intensity along the length of the ringfield illumination field that is projected onto the reticle; and (vi) a wafer onto which the reticle imaged is projected from the ringfield camera.

14 Claims, 2 Drawing Sheets

RETICLE STAGE BASED LINEAR DOSIMETER

This invention was made with Government support under Contract No. DE-AC04-94AL85000 awarded by the U.S. Department of Energy to Sandia Corporation. The Government has certain rights to the invention.

FIELD OF THE INVENTION

This invention relates to an apparatus for measuring the intensity of extreme ultraviolet radiation at the reticle plane of a projection photolithography device. The apparatus can be employed to estimate machine throughput and illumination uniformity.

BACKGROUND OF THE INVENTION

In general, lithography refers to processes for pattern transfer between various media. A lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing and has supplanted proximity printing. "Long" or "soft" x-rays (a.k.a. Extreme UV) (wavelength range of $\lambda=100$ to $200$ Å) are now at the forefront of research in efforts to achieve the smaller desired feature sizes. With projection photolithography, a reticle (or mask) is imaged through a reduction-projection lens onto a wafer. Reticles for EUV projection lithography typically comprise an ultra-low expansion material substrate coated with an EUV reflective material and an optical pattern fabricated from an EUV absorbing material that is formed on the reflective material. As is apparent, projection lithography systems are non-telecentric in that incident radiation from the condenser is not normal to the reflecting reticle surface.

In operation, EUV radiation from the condenser is projected toward the surface of the reticle and radiation is reflected from those areas of the reticle reflective surface which are exposed, i.e., not covered by the EUV absorbing material. The reflected radiation effectively transcribes the pattern from the reticle to the wafer positioned downstream from the reticle. Conventional EUV lithographic projection systems employ a scanning exposure device that uses simultaneous motion of the reticle and wafer, with each substrate being mounted on a chuck that is attached to an X-Y stage platen, to continuously project a portion of the reticle onto the wafer through a projection optics. Scanning, as opposed to exposure of the entire reticle at once, allows for the projection of reticle patterns that exceed in size that of the image field of the projection system. Laser interferometry is typically used to determine the actual stage platen position.

Efficient operations requires that the EUV illumination on the reticle be periodically measured and the lithography system adjusted, if necessary, to maintain illumination uniformity.

SUMMARY OF THE INVENTION

The invention is based, in part, the development of a detector that can image the entire reticle illumination profile in a photolithography system.

According, in one embodiment, the invention is directed to a photolithography system for projecting a mask image onto a wafer that includes:

a ringfield camera;

a source of radiation;

a condenser for processing radiation from said source of radiation to produce a ringfield illumination field for illuminating a mask;

a reticle that is positioned at the ringfield camera's object plane and from which a reticle image in the form of an intensity profile is reflected into the entrance pupil of the ringfield camera, wherein the reticle is secured to a stage that moves in a direction that is transverse to the length of the ringfield illumination field that illuminates the reticle;

means for measuring the entire intensity along the length of the ringfield illumination field that is projected onto the reticle; and a wafer onto which the reticle imaged is projected from the ringfield camera.

In another embodiment, the invention is directed to a photolithography process implemented in a system that includes a reticle stage that supports a reflective reticle, a wafer that is positioned downstream from the reflective reticle, an illumination device that projects radiation toward the reflective reticle, and a projection optics device that collects radiation reflected from the reflective reticle and directs the radiation toward the wafer, wherein the process includes the steps of:

(a) measuring the intensity profile along the entire length of the radiation that is projected on the reflective reticle; and (b) modifying the intensity profile.

In a preferred embodiment, a dosimeter comprising a linear array of discrete photodiodes is used measure the intensity profile.

DETAILED DESCRIPTION OF THE INVENTION

Figure 1:
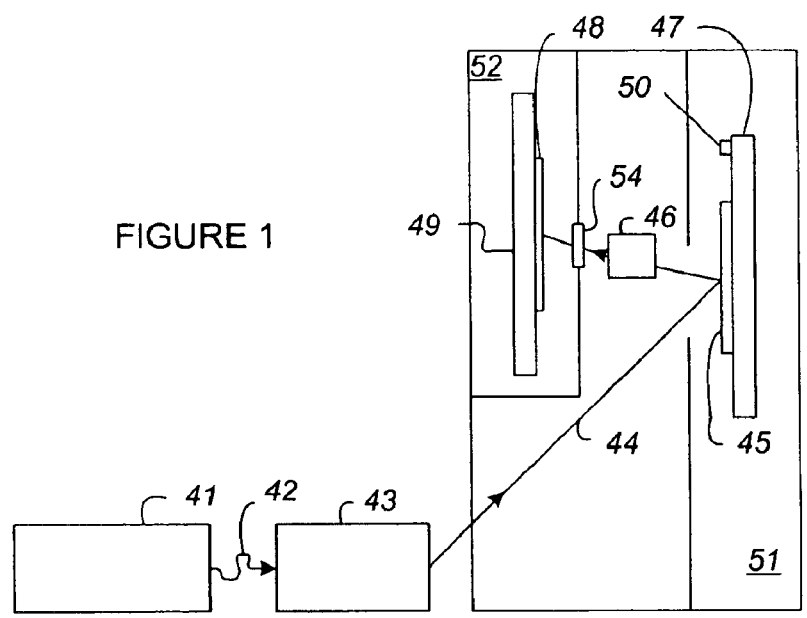
FIG. 1 illustrates an EUV lithography apparatus.

The detector device of the present invention is particularly suited for measuring the intensity of EUV at the reticle plane in scanning lithography systems. FIG. 1 schematically depicts an EUV lithography (EUVL) apparatus that comprises a radiation source 41, such as a synchrotron or a laser plasma source, that emits EUV radiation 42 into condenser 43 which in turn emits beam 44 that illuminates a portion of reticle or mask 45. As further described herein, in a preferred embodiment, the cross-section of beam 44 has the shape of an arcuate or curved strip. The emerging patterned beam is introduced into the projection or imaging optics device 46 (e.g., camera) which projects an image of mask 45, shown mounted on mask stage platen assembly 47, onto wafer 48 which is mounted on wafer stage platen assembly 49. Positioned on reticle stage platen assembly 47 is device EUV intensity measuring 50 for measuring the entire intensity of illumination of beam 44 that illuminates the reticle. Each of the stage platen assemblies 47 and 49 comprises a stage platen and associated components for its maneuver. Each stage platen assembly can be adjusted in three orthogonal linear axes and in three orthogonal rotational axes. Precision movement of stage platen assemblies can be implemented by known mechanisms as described, for example, in U.S. Pat. Nos. 5,623,853, 5,699,621, and 6,353,271 which are incorporated herein by reference.

The stage platen assemblies 47 and 49 are preferably housed in separate chambers that are separated from the other elements of the photolithography system located upstream as illustrated in FIG. 1. Stage platen assembly 47 supporting mask 45 is housed in mask chamber or zone 51 which is typically maintained at sub-atmospheric pressure preferably between 1 mTorr to 100 mTorr. Similarly, stage platen assembly 49 supporting wafer 48 is housed in wafer chamber or zone 52 which is preferably maintained at a pressure below about 100 mTorr. Chamber 52 may include a window 54 that is made of a suitable material that transmits EUV, alternatively, an aperture with a gas curtain to deflect debris can be employed. The other elements can be housed in one or more chambers which are preferably maintained in vacuum to minimize attenuation of the EUV radiation. In operations, EUV radiation projected from the mask 45 and translated by a camera 46 travels through a window 54 in the wafer chamber 52. The individual elements that form the EUV lithography device as shown in FIG. 1 can comprise conventional optical devices, e.g., condensers, cameras, and lens, for projection EUV lithography.

In a preferred embodiment, the EUVL device employs a condenser that collects EUV for illuminating a ringfield camera. All ringfield optical forms are based on radial dependence of aberration and use the technique of balancing low order aberrations, i.e., third order aberrations, with higher order aberrations to create long, narrow arcuate fields of aberration correction located at a fixed radius as measured from the optical axis of the system (regions of constant radius, rotationally symmetric with respect to the axis). Consequently, the shape of the corrected region is an arcuate or curved strip rather than a straight strip. The arcuate strip is a segment of the circular ring with its center of revolution at the optic axis of the camera. An arcuate slit can be defined by a width, W, and length, L, and depicted as a portion of a ringfield defined by radial dimension, R, spanning the distance from an optic axis and the center of the arcuate slit. The strip width defines a region in which features to be printed are sharply imaged. Outside this region, increasing residual astigmatism, distortion, and Petzval curvature at radii greater or smaller than the design radius reduce the image quality to an unacceptable level. Use of such an arcuate field allows minimization of radially-dependent image aberrations in the image and use of object:image size reduction of, for example, 4:1 reduction, results in significant cost reduction of the, now, enlarged-feature mask.

U.S. Pat. No. 6,118,577 to Sweatt et al. discloses a suitable condenser system that couples radiation from a small diameter source to a ringfield camera. The condenser system typically includes six substantially equal radial segments of a parent aspheric mirror, each having one focus at the radiation source and a line focus filling the object field of the camera at the radius of the ringfield and each producing a beam of radiation. The condenser system also includes a corresponding number of sets of correcting mirror which are capable of translation or rotation, or both, such that all of the beams of radiation pass through the real entrance pupil of the camera and form a coincident arc image at the ringfield radius.

Figure 2:
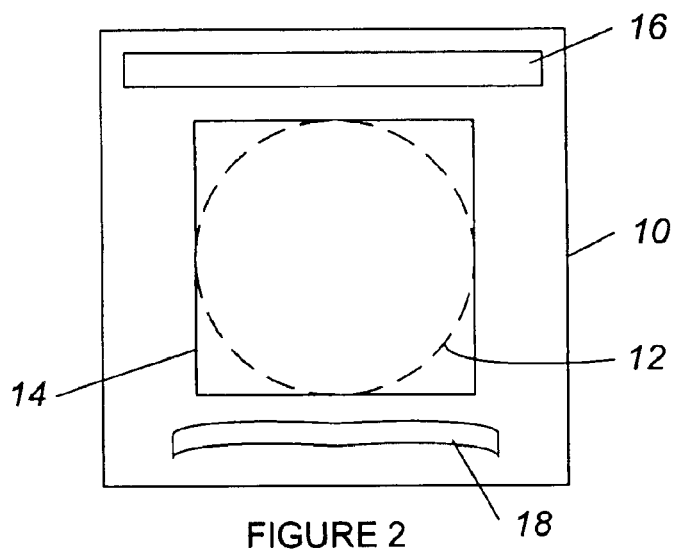
FIG. 2 is the top view of a reticle stage assembly.

FIG. 2 shows the top surface of reticle stage platen 10 to which is secured chuck 12 that supports reticle 14. Preferably, the chuck is an electrostatic chuck (ESC) because this design combines the advantages of the more uniform clamping ability of vacuum chucks and the usability in vacuum environments of mechanical chucks. ESC devices are known in the art and are described, for example, in U.S. Pat. Nos. 5,221,403, 5,835,333 and 5,835,334 which are incorporated herein by reference. An elongated detector device 16 is positioned on the reticle stage platen to measure the intensity of arcuate slit 18 that illuminates the reticle. The reticle stage platen 10 is preferably fabricated of a glass ceramic material. Suitable reticle stage platen are described in U.S. Pat. No. 6,188,150 to Spence et al. which is incorporated herein by reference. In a ringfield lithography system the arcuate slit is 18 scanned across the reticle surface 14. Therefore it integrates the exposure along that direction. Consequently the uniformity of the field across the width of the slit along the (scan direction) is not critical, but the integral of the intensity across the width of the slit is important. The variation of this integral along the length of the slit is preferably less than 0.1%.

Figure 3:
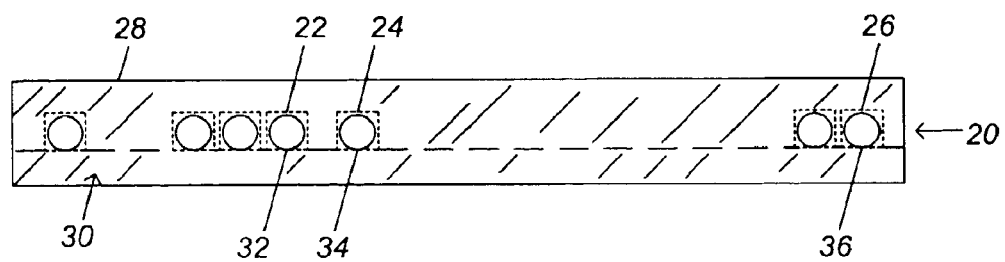
FIG. 3 is a schematic of a linear array of photodiodes.

As shown in FIG. 3, detector device 16 preferably comprises a linear array of photodiodes, which are spaced evenly apart; the array is scaled to image the entire length of the arcuate slit illumination profile 18 (FIG. 2). The device 20 includes a plurality of photodiodes 22, 24, 26 that are mounted and bonded within a sensor module 28. In addition, a pinhole assembly that comprises an elongated member 30 with an array of pinholes 32, 34, and 36 is positioned above the array of photodiodes with each photodiode being aligned to a corresponding pinhole. Preferably, each pinhole has a diameter of 100 $\mu$m or 200 $\mu$m. Preferably for EUV lithography applications, the registration error is no more than +/−0.002 in. (about 50 $\mu$m). The detector preferably makes uniformity measurements accurate to within 1 part in 1000.

Photodiodes are well known in the art and are particulary suited since they exhibit the requisite dynamic range from EUV lithography applications that is typically not attainable with other detector technologies such as CCD, phosphor, or pyro-electric devices. A suitable commercially available photodiode for applications in vacuum extreme ultraviolet radiation is a silicon p-n junction photodiode, model AXUV series from International Radiation Detectors Inc. (Torrance Calif.). Photodiodes can be purchased separately or wafers containing photodiodes can be obtained and diced to the desired size. For example, wafers can be sawn into strips or sections each containing a plurality of photodiodes arranged linearly. Multiple strips are juxtaposed at their ends to create a linear array of photodiodes. This technique facilitates uniformity and registration of the individual photodiodes. Another suitable device is a monolithic pattern-sensitive detector which employs a precisely defined reference pattern formed over a shallow junction photodiode which is described in U.S. Pat. No. 6,130,431 to Berger, which is incorporated herein by reference. Photodiodes also provide excellent sensitivity for the intensities that are present at the reticle plane. In some applications, it is expected that an effective charge of about 1 pico coulomb will be produced from each array element per EUV pulse from a laser radiation source.

Figure 4:
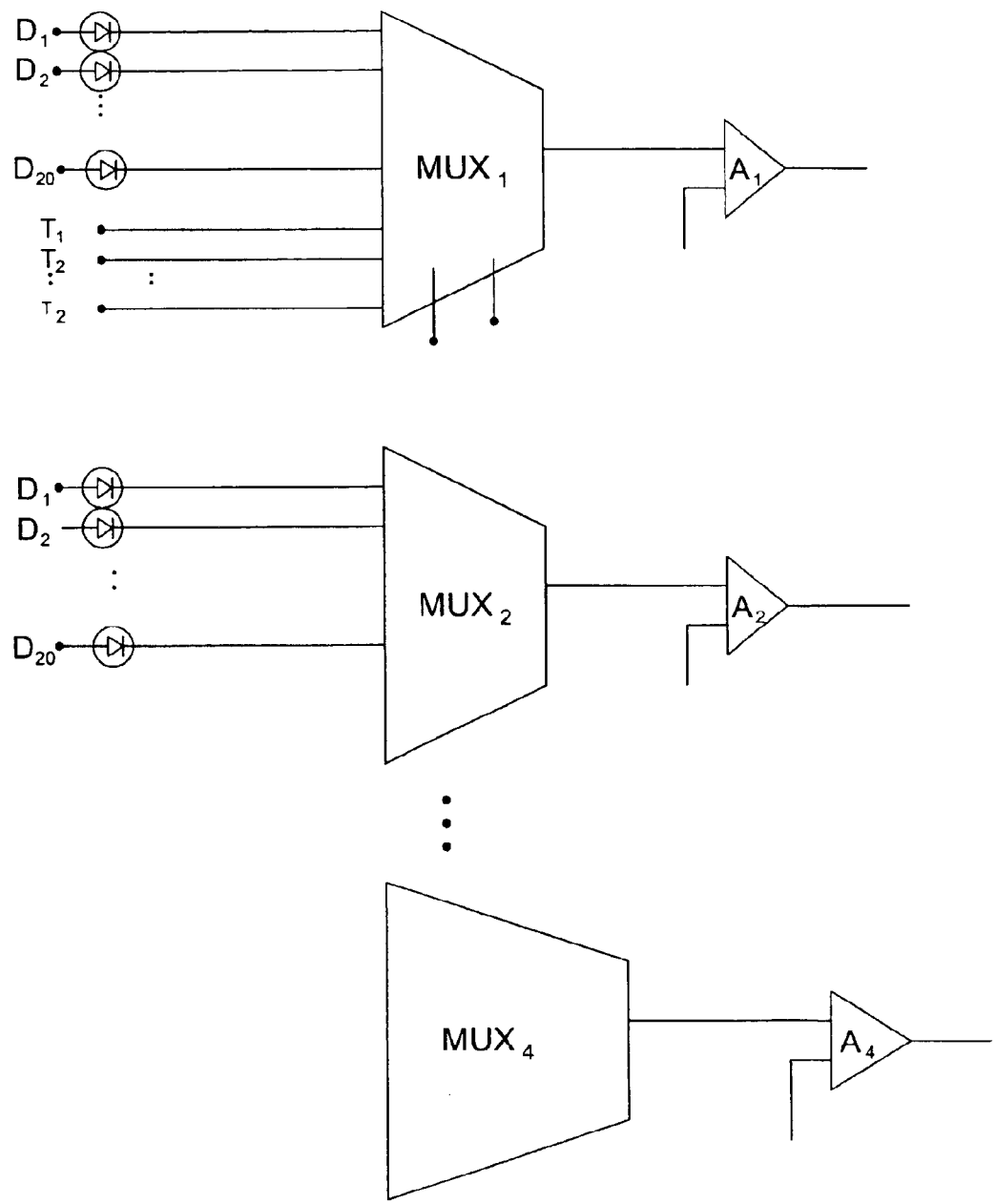
FIG. 4 is an electrical diagram for the array of photodiodes.

A linear dosimeter was constructed using 80 EUV photodiodes. The photodiodes were sawn from a single wafer in strips of 20 photodiodes per ship. Four of these strips were butted from end to end to create the entire array of 80 photodiodes. The discrete filtered photodiodes were positioned 1.66 mm apart as measured form center to center thereby creating a dosimeter that spanned 132 mm. As illustrated in FIG. 4, each of the individual photodiodes (Dx) is connected to an amplifier assembly Ax through a multiplexer MUX. Thus the linear dosimeter had 4 discrete active channels of 20 diodes each. Since there are 32 selectable addresses in each channel, the remaining 12 additional addresses can be used far charge injection in situ testing of the linear dosimeter in the EUV lithography chamber.

The EUV intensity measurements at the reticle plane can be employed to estimate machine throughput, i.e., total intensity of the illumination, and illumination uniformity along the length of the arcuate slit. When measuring the EUV intensity profile it may be necessary to ascertain multiple measurements of the arcuate slit as it scan passes the linear array of photodiodes. In other words, the resultant EUV profile is collected over several "shots" of data. Typically, these measurements are made periodically and modifications to the lithography system can be implemented to restore the illumination uniformity along the length of the arcuate slit and/or total intensity, if necessary, after comparing the measurements to the desired, e.g., preset, level(s). The adjustments include, for example, (i) moving the stage platen assembly, on which the linear dosimeter is positioned, along any of its six degrees of freedom and/or (ii) maneuvering any of the mirrors in the lithography system, e.g., condenser camera. Finally, if the overall intensity of the illumination is too low or high, the radiation source can also be adjusted accordingly.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A photolithography system for projecting a mask image onto a wafer that comprises:
   a ringfield camera;
   a source of radiation;
   a condenser for processing radiation from said source of radiation to produce a ringfield illumination field for illuminating a mask;
   a reticle that is positioned at the ringfield camera's object plane and from which a reticle image in the form of an intensity profile is reflected into the entrance pupil of the ringfield camera, wherein the reticle is secured to a stage that moves in a direction that is transverse to the length of the ringfield illumination field that illuminates the reticle;
   a linear array of discrete photodiodes for measuring the entire intensity along the length of the ringfield illumination field that is projected onto the reticle wherein each photodiode generates an electrical signal that is indicative of intensity;
   a multiplexer that is connect to the discrete photodiode for selectively acquiring one of the electrical signals; and
   a wafer onto which the reticle imaged is projected from the ringfield camera.

2. The system of claim 1 wherein the reticle is positioned on a stage platen and wherein the linear array of discrete photodiodes is housed in a module that is positioned on the stage platen.

3. The system of claim 2 further comprising means for adjusting the intensity along the length of the ringfield illumination field.

4. The system of claim 1 further comprising means for adjusting the intensity along the length of the ringfield illumination field.

5. The system of claim 4 wherein the means for adjusting the intensity moves the stage platen in one or more directions that correspond to at least one of its three orthogonal linear axes and/or one of its three orthogonal rotational axes.

6. The system of claim 1 wherein the source of radiation generates extreme ultraviolet radiation.

7. The system of claim 1 comprising a linear array of discrete extreme ultraviolet radiation photodiodes.

8. The system of claim 7 wherein each photodiode is connected to an amplifier assembly through the multiplexer.

9. The system of claim 1 wherein each photodiode is connected to an amplifier assembly through the multiplexer.

10. The system of claim 7 wherein the reticle is positioned on a stage platen and wherein the linear array of discrete photodiodes is housed in a module that is positioned on the stage platen.

11. The system of claim 10 further comprising means for adjusting the intensity along the length of the ringfield illumination field.

12. The system of claim 8 further comprising means for adjusting the intensity along the length of the ringfield illumination field.

13. The system of claim 12 wherein the means for adjusting the intensity moves the stage platen in one or more directions that correspond to at least one of its three orthogonal linear axes and/or one of its three orthogonal rotational axes.

14. The system of claim 7 wherein the source of radiation generates extreme ultraviolet radiation.

* * * * *